(12) United States Patent
Lim et al.

(10) Patent No.: US 12,733,427 B2
(45) Date of Patent: Sep. 8, 2026

(54) APPARATUS OF CLEANING SUBSTRATE, APPARATUS OF SEMICONDUCTOR DEVICE AND METHOD FOR MANUFACTURING A SEMICONDUCTOR PACKAGE USING THE SAME

(71) Applicant: Samsung Electronics Co., Ltd., Suwon-si (KR)

(72) Inventors: Hyo Shin Lim, Suwon-si (KR); Ho Jun Lee, Cheonan-si (KR)

(73) Assignees: Samsung Electronics Co., Ltd., Gyeonggi-do (KR); SEMES CO., LTD., Cheonan-si (KR)

(*) Notice: Subject to any disclaimer, the term of this patent is extended or adjusted under 35 U.S.C. 154(b) by 326 days.

(21) Appl. No.: 18/351,754

(22) Filed: Jul. 13, 2023

(65) Prior Publication Data

US 2024/0242979 A1 Jul. 18, 2024

(30) Foreign Application Priority Data

Jan. 18, 2023 (KR) ........................ 10-2023-0007545

(51) Int. Cl.
*H10P 72/00* (2026.01)

(52) U.S. Cl.
CPC ...... *H10P 72/0412* (2026.01); *H10P 72/0456* (2026.01); *H10P 72/0468* (2026.01); *H10P 72/0602* (2026.01)

(58) Field of Classification Search
CPC ......... H01L 21/67046; H01L 21/67173; H01L 21/67207; H01L 21/67248
USPC ............................................................ 134/66
See application file for complete search history.

(56) References Cited

U.S. PATENT DOCUMENTS

2008/0173335 A1 7/2008 Yoon et al.
2016/0020115 A1* 1/2016 Demichi ........... H01L 21/31116 438/735

FOREIGN PATENT DOCUMENTS

| | | | |
|---|---|---|---|
| JP | 2004/207424 | A | 7/2004 |
| KR | 2006/0029928 | A | 4/2006 |
| KR | 2007/0043192 | A | 4/2007 |
| KR | 100865893 | B1 | 10/2008 |
| KR | 101169745 | B1 | 7/2012 |
| KR | 10-2017-0070723 | A | 6/2017 |
| KR | 10-2018-0111381 | A | 10/2018 |
| KR | 101930496 | B1 | 12/2018 |

(Continued)

OTHER PUBLICATIONS

JP2004207424A—machine translation (Year: 2004).*

(Continued)

*Primary Examiner* — Tinsae B Ayalew
(74) *Attorney, Agent, or Firm* — Harness, Dickey & Pierce, P.L.C.

(57) ABSTRACT

A substrate cleaning apparatus may include a steam injector configured to clean a substrate, a steam supplier configured to supply a steam, and a gas supplier configured to supply a gas. The steam injector may include a drive unit configured to move horizontally, a plate on the drive unit, and a plurality of nozzles on the plate. The plate may include a temperature sensor, a first pressure sensor, and a second pressure sensor. Each of the plurality of nozzles may be connected to the steam supplier and the gas supplier. The plurality of nozzles may be arranged in one direction from a planar viewpoint.

12 Claims, 9 Drawing Sheets

(56) References Cited

FOREIGN PATENT DOCUMENTS

| | | | |
|---|---|---|---|
| KR | 10-2019-0108784 | A | 9/2019 |
| KR | 102233982 | B1 | 3/2021 |
| KR | 2021/0050728 | A | 5/2021 |
| KR | 2022/0040010 | A | 3/2022 |

OTHER PUBLICATIONS

Korean Office Action issued in corresponding Korean Patent Application No. KR 10-2023-0007545, dated Jul. 10, 2026 and English translation thereof.

* cited by examiner 1
10
20
30
R
5
320
330
310
270
200
220
210
213
223
280
290
R
5
3
110
150
180
190
110
MZ
500
D1
D2
D3

Fig. 3

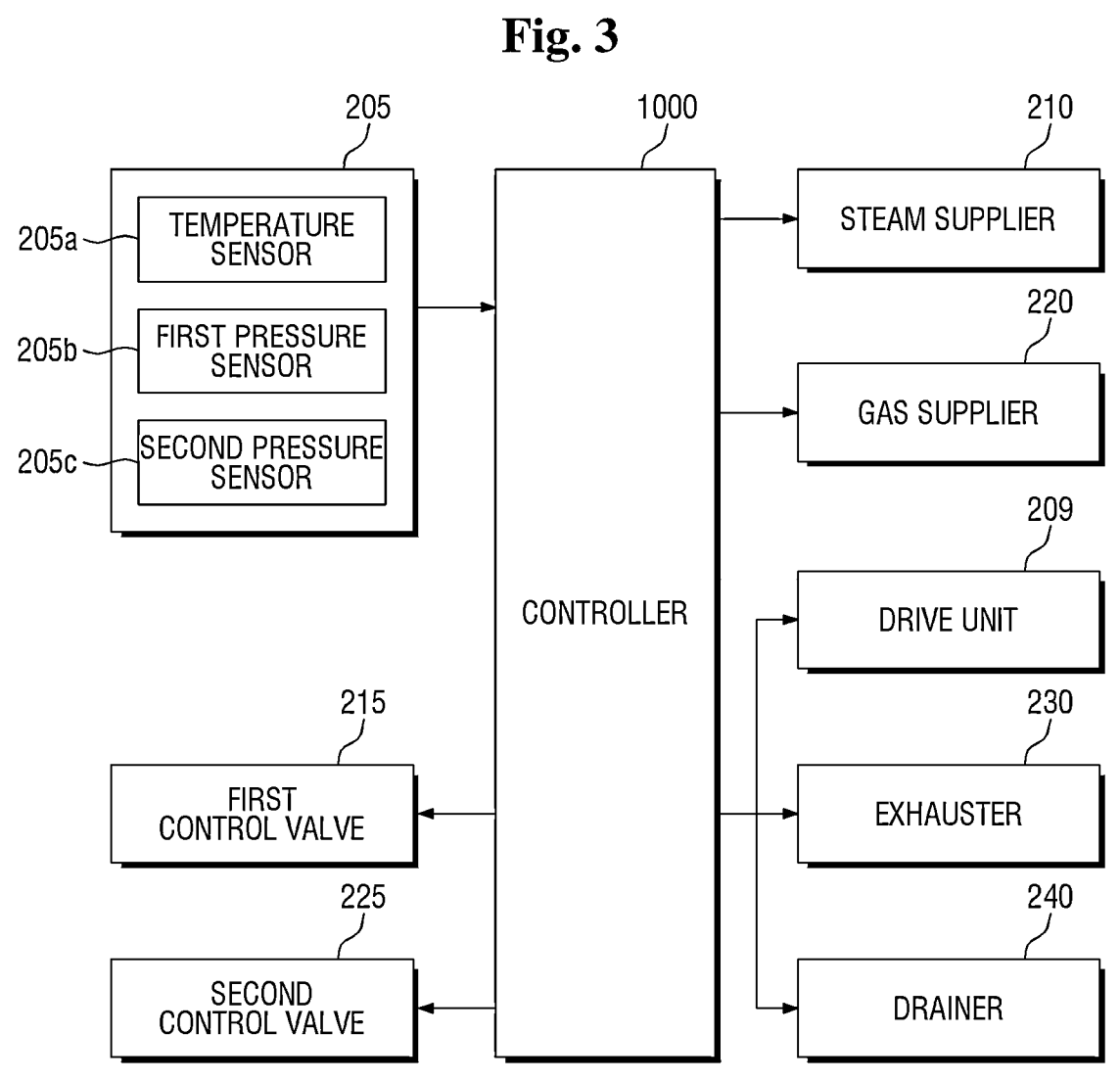

205
1000
210
205a TEMPERATURE SENSOR
205b FIRST PRESSURE SENSOR
205c SECOND PRESSURE SENSOR
STEAM SUPPLIER
220
GAS SUPPLIER
209
CONTROLLER
DRIVE UNIT
215
230
FIRST CONTROL VALVE
EXHAUSTER
225
240
SECOND CONTROL VALVE
DRAINER

APPARATUS OF CLEANING SUBSTRATE, APPARATUS OF SEMICONDUCTOR DEVICE AND METHOD FOR MANUFACTURING A SEMICONDUCTOR PACKAGE USING THE SAME

CROSS-REFERENCE TO RELATED APPLICATIONS

This U.S. non-provisional patent application claims priority under 35 U.S.C. § 119 to Korean Patent Application No. 10-2023-0007545, filed on Jan. 18, 2023, the entire contents of which are hereby incorporated by reference.

BACKGROUND

Example embodiments relate to a substrate cleaning device, a semiconductor apparatus including the same, and a method for manufacturing a semiconductor package using the same, and more particularly, to a substrate cleaning apparatus including a cleaning device using steam, a semiconductor apparatus including the same, and a method for manufacturing a semiconductor package using the same.

In general, semiconductor elements may be formed on a silicon wafer used as a semiconductor substrate by repeatedly performing a series of manufacturing processes, and the semiconductor elements may be formed into semiconductor strips made up of a plurality of semiconductor packages through a dicing process, a die bonding process, and a molding process. The semiconductor strips may be individualized into a plurality of semiconductor packages through a sawing and sorting process. The sawing and sorting process may utilize sawing blades, and may a cleaning process may be performed on the individualized semiconductor packages. The cleaning process may limit and/or prevent whitening contamination that may occur in the semiconductor package.

SUMMARY

Various example embodiments provide a substrate cleaning apparatus including a cleaning device using steam, a semiconductor apparatus including the same, and a method for manufacturing a semiconductor package using the same.

However, example embodiments are not restricted to the one set forth herein. The above other aspects of example embodiments will become more apparent to one of ordinary skill in the art to which example embodiments pertain by referencing the detailed description of embodiments of inventive concepts given below.

According to some example embodiments, a substrate cleaning apparatus may include a steam injector configured to clean a substrate; a steam supplier configured to supply a steam; and a gas supplier configured to supply a gas. The steam injector may include a drive unit configured to move horizontally, a plate on the drive unit, and a plurality of nozzles on the plate. The plate may include a temperature sensor, a first pressure sensor, and a second pressure sensor. Each of the plurality of nozzles may be connected to the steam supplier and the gas supplier. The plurality of nozzles may be arranged in one direction from a planar viewpoint.

According to some example embodiments, a semiconductor apparatus may include a substrate sawing device configured to form semiconductor packages by sawing semiconductor strips in a substrate; a substrate sorting device configured to sort the semiconductor packages; a substrate cleaning device between the substrate sawing device and the substrate sorting device, the substrate cleaning device being configured to clean the semiconductor packages; and a pickup unit configured to move the semiconductor packages. The substrate cleaning device may include a steam injector, an upper guide, and a lower guide. The steam injector may include a drive unit, a sensor unit, and a plurality of nozzles. The upper guide may provide a standby space in which the pickup unit may be located. The lower guide may include a slit. When the pickup unit is in the standby space, a cleaning space may be formed by the upper guide, the lower guide and the pickup unit. The steam injector may be in the cleaning space. The plurality of nozzles may be arranged in one direction from a planar viewpoint.

According to some example embodiments, a method for manufacturing a semiconductor package may include loading a substrate into a semiconductor processing apparatus; sawing the substrate to form semiconductor packages; cleaning the semiconductor packages; and sorting the semiconductor packages. The cleaning the semiconductor packages may include forming a cleaning space using a substrate cleaning device, injecting a steam into the cleaning space using a steam injector, and drying the semiconductor packages. A sensor unit of the steam injector may transmit information on temperature and pressure of the steam to a controller while the steam injector injects the steam into the cleaning space.

These and other details of example embodiments are included in the detailed description and drawings.

The substrate cleaning apparatus can clean the semiconductor packages using steam injected from a steam injector. Since the steam injector does not come into direct contact with the semiconductor package, a wearing phenomenon may not occur. Since there is no need to replace the steam injector, the productivity of semiconductor packages can be improved. Also, since the plurality of injection ports of the steam injector are placed in one direction and reciprocate in a horizontal direction, the plurality of semiconductor packages can be uniformly cleaned.

Since the temperature and pressure of steam are important factors in the method for manufacturing the semiconductor package of example embodiments, a sensor unit of the steam injector may transmit information on the temperature and pressure of steam to a controller. Therefore, a constant detergency can be secured.

BRIEF DESCRIPTION OF THE DRAWINGS

The above and other aspects and features of example embodiments will become more apparent by describing in detail example embodiments thereof with reference to the attached drawings, in which:

FIG. 3 is a block diagram showing a substrate cleaning apparatus according to example embodiments;

DETAILED DESCRIPTION

Hereinafter, example embodiments will be described below with reference to the accompanying drawings. The same reference numbers may refer to the same constituent elements throughout the specification.

Figure 1:
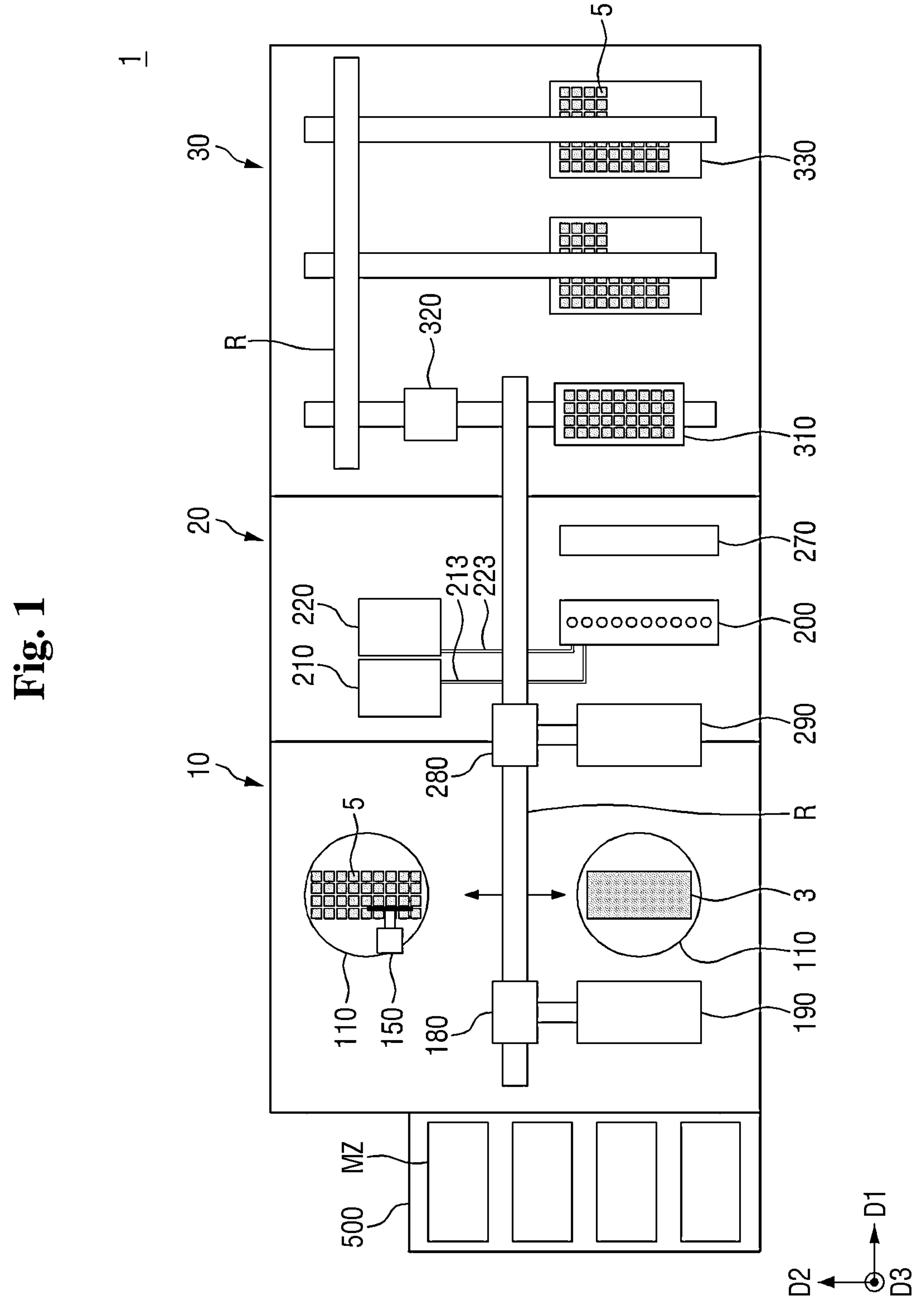
FIG. 1 is a plan view for explaining a semiconductor apparatus according to example embodiments.

FIG. 1 is a plan view for explaining a semiconductor apparatus according to example embodiments.

Referring to FIG. 1, a semiconductor apparatus 1 may be provided. For example, the semiconductor apparatus 1 may be a device which manufactures a semiconductor package. The semiconductor apparatus 1 may be a device which saws and sorts the semiconductor package, and may be a device which saws a substrate 3 to form a plurality of semiconductor packages 5, and sorts the plurality of semiconductor packages 5. For example, the substrate 3 may be, but is not limited to, a semiconductor strip. The semiconductor apparatus 1 may be referred to as a semiconductor processing apparatus.

The semiconductor apparatus 1 may include a substrate sawing device 10, a substrate cleaning device 20 and a substrate sorting device 30. The substrate cleaning device 20 is located between the substrate sawing device 10 and the substrate sorting device 30, and may be in contact with the substrate sawing device 10 and the substrate sorting device 30. The semiconductor apparatus 1 may further include conveying rails R located at the substrate sawing device 10, the substrate cleaning device 20 and the substrate sorting device 30. The conveying rails R may extend in a first direction D1 from the substrate sawing device 10 to the substrate sorting device 30 through the substrate cleaning device 20.

The semiconductor apparatus 1 may further include a loading device 500. The loading device 500 may be located on a side face of the substrate sawing device 10. That is, the substrate sawing device 10 may be located between the loading device 500 and the substrate cleaning device 20. Magazines MZ may be located on the loading device 500. The substrates 3 may be stored in the magazines MZ. In other words, the substrates 3 may be supplied to the semiconductor apparatus 1 through the loading device 500.

The substrate sawing device 10 may include a substrate fixer 110, a sawing blade 150, a first conveyor 180, and a first pickup unit 190. Each of the substrates 3 stored in the magazines MZ may be moved into the substrate sawing device 10 through a conveying robot (not shown) or a guide rail (not shown). The substrate 3 moved into the substrate sawing device 10 is fixed by the first pickup unit 190, and then may be conveyed onto the substrate fixer 110. Specifically, the first pickup unit 190 may be moved in the first direction D1 by the first conveyor 180. The first conveyor 180 is located on the conveying rail R and may move on the conveying rail R. The first pickup unit 190 may rotate to adjust a placement direction of the substrate 3. For example, the substrate 3 may be rotated by 90° by the first pickup unit 190 after being moved from the magazine MZ to the substrate sawing device 10. The substrate 3 may then be moved onto the substrate fixer 110.

The substrate fixer 110 may include a vacuum chuck. That is, the substrate fixer 110 may fix the substrate 3 with a vacuum chuck. The substrate fixer 110 may be moved under the sawing blade 150 by a separate conveyor (not shown). The sawing blade 150 may saw the substrate 3 located on the substrate fixer 110. Therefore, the substrate 3 may be formed into a plurality of semiconductor packages 5. However, example embodiments are not limited thereto. That is, the substrate sawing device 10 may saw the substrate 3 using laser or plasma to form a plurality of semiconductor packages 5.

The substrate cleaning device 20 may include a steam injector 200, a steam supplier 210, a gas supplier 220, a preliminary cleaner 270, a second conveyor 280, and a second pickup unit 290. The second pickup unit 290 may move in the first direction D1 by the second conveyor 280. The second conveyor 280 may be spaced apart from the first conveyor 180 in the first direction D1. The second conveyor 280 is located on the conveying rail R and may move on the conveying rail R. The second pickup unit 290 may move from the substrate sawing device 10 to the substrate sorting device 30 through the substrate cleaning device 20. After fixing the plurality of semiconductor packages 5, the second pickup unit 290 may be moved in the first direction D1.

Specifically, the plurality of semiconductor packages 5 may be located on the stream injector 200 by the second pickup unit 290. The steam injector 200 may remove foreign matter adhering to the plurality of semiconductor packages 5 using steam. That is, the stream injector 200 may clean the plurality of semiconductor packages 5, without coming into direct contact with the plurality of semiconductor packages 5. Accordingly, a wearing phenomenon of the steam injector 200 may not occur. Therefore, since a cycle of preventive maintenance of the substrate cleaning device 20 is lengthened, the productivity of semiconductor packages may be improved. For example, foreign matter may include dust of an EMC (epoxy molding compound) and dust of a printed circuit board (PCB).

The preliminary cleaner 270 may be spaced apart from the steam injector 200 in the first direction D1. A plurality of semiconductor packages 5 may reach the preliminary cleaner 270 after passing through the steam injector 200. That is, primary cleaning may be performed through the steam injector 200, and secondary cleaning may be performed through the preliminary cleaner 270. Contamination of the plurality of semiconductor packages 5 may vary depending on the types of semiconductor package. Therefore, if the semiconductor package is severely contaminated, the detergency and amount of cleaning may be increased, using the steam injector 200 and the preliminary cleaner 270. That is, the preliminary cleaner 270 may or may not be used depending on the types of semiconductor package. For example, preliminary cleaner 270 may include, but is not limited to, a sponge brush. According to other embodiments, the preliminary cleaner 270 may be omitted.

The steam supplier 210 and the gas supplier 220 may be placed to be spaced apart from the steam injector 200. The steam supplier 210 may be connected to the steam injector 200 through a steam supply line 213. The gas supplier 220 may be connected to the steam injector 200 through a gas supply line 223. The steam supplier 210 may include a heater and a pressurizer. That is, the steam supplier 210 may heat water to form vapor, and compress the vapor to form steam. The gas supplier 220 may include a pressurizer (e.g., pump). Accordingly, the gas supplier may supply the gas to the stream injector 200 at various pressures. For example, the heater of the steam supplier 210 may include a heater that uses a hot wire. The pressurizer of the steam supplier 210 and the gas supplier 220 may include a pump. The gas of the gas supplier 220 may include an inert gas, which may be, for example, nitrogen ($N_2$) or argon (Ar).

The substrate sorting device 30 may include a conveying tray 310, an inspection module 320, and storage trays 330. A plurality of semiconductor packages 5 that have been cleaned may be located onto the conveying tray 310 by the second pickup unit 290. The conveying tray 310 may move in a second direction D2 and be located under the inspection module 320. A plurality of semiconductor packages 5 on the conveying tray 310 may then be inspected by the inspection module 320. The inspection module 320 may include a camera, and it may be sorted whether the plurality of semiconductor packages 5 are non-defective products or defective products through images of the camera. Each of the plurality of semiconductor packages 5 that have been inspected may be conveyed to different storage trays 330 depending on whether they are non-defective products or defective products. The plurality of semiconductor packages 5 may be conveyed by separate conveyors (not shown).

Figure 2:
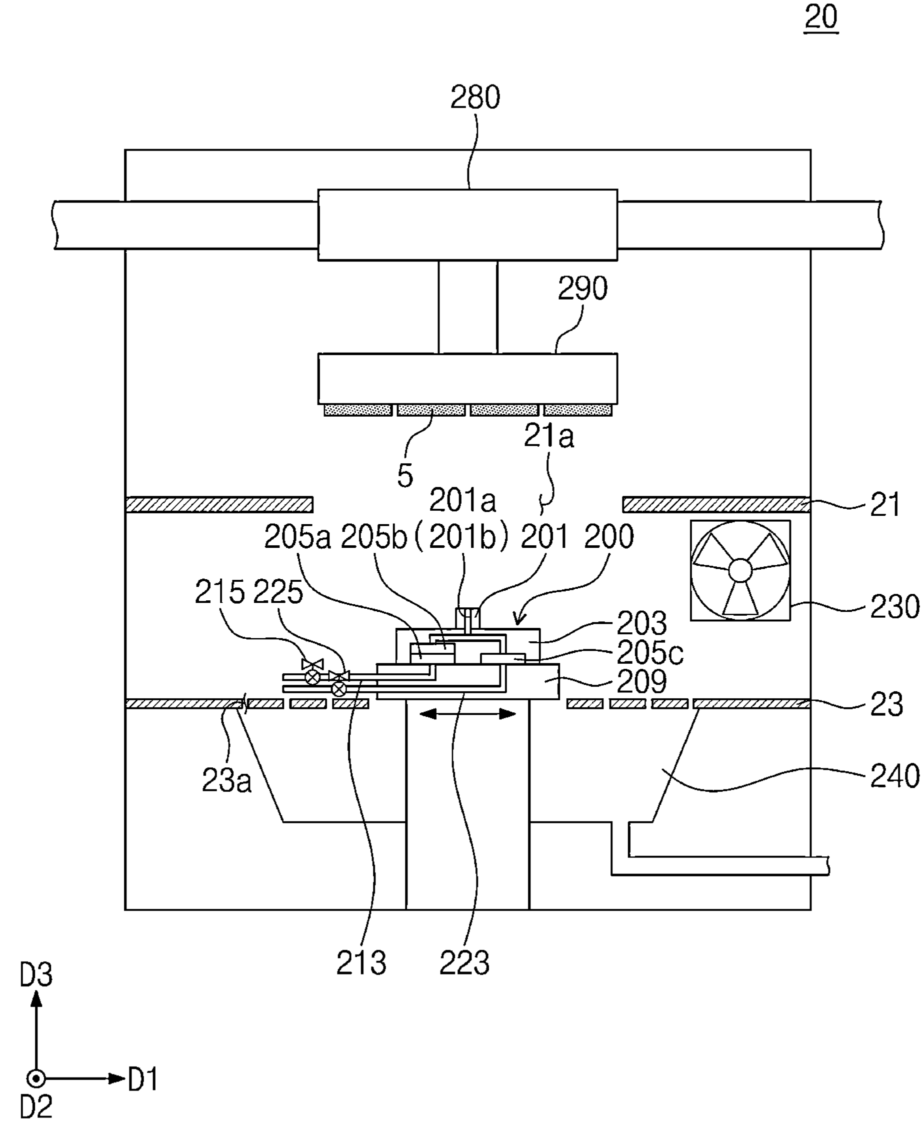
FIG. 2 is a cross-sectional view for explaining a substrate cleaning apparatus according to example embodiments.

FIG. 2 is a cross-sectional view for explaining a substrate cleaning device according to example embodiments. FIG. 3 is a block diagram showing the substrate cleaning device according to example embodiments.

Hereinafter, for convenience of description, descriptions of the same items as those described with reference to FIG. 1 will be omitted, and differences will be described in detail.

Referring to FIGS. 2 and 3, the substrate cleaning device 20 may perform a process of cleaning a plurality of semiconductor packages 5 fixed to the second pickup unit 290. The substrate cleaning device 20 may include a steam injector 200, an upper guide 21, a lower guide 23, an exhauster 230 and a drainer 240.

The upper guide 21 may be located under the second conveyor 280, and provide a standby space 21*a*. The standby space 21*a* may be placed at the center of the upper guide 21 from a planar viewpoint. The second pickup unit 290 is movable in a third direction D3, and may be located inside the standby space 21*a*. That is, the second pickup unit 290 and the upper guide 21 may be located on the same plane. In this case, the upper guide 21 may have a form that surrounds the second pickup unit 290.

The lower guide 23 may be placed below the upper guide 21. The lower guide 23 may provide a slit 23*a*. In the method for manufacturing a semiconductor package, which will be described below, waste water generated by cleaning the plurality of semiconductor packages 5 may move to the drainer 240 through the slit 23*a*. That is, the slit 23*a* of the lower guide 23 may be a passage through which waste water moves. The lower guide 23 may include a plurality of slits 23*a*.

The steam injector 200 may be located between the upper guide 21 and the lower guide 23. The steam injector 200 may include a plurality of nozzles 201, a plate 203 and a drive unit 209. The drive unit 209 may include a motor and may receive power through circuitry connected to a power supply and the controller 1000 may control operations of the drive unit 209. The steam injector 200 may be connected to the steam supply line 213 and the gas supply line 223. A first control valve 215 may be located on the steam supply line 213. A second control valve 225 may be located on the gas supply line 223. For example, the first and second control valves 215 and 225 may include solenoid valves. For convenience of the description, the plurality of nozzles 201 will be described as singular.

The nozzle 201 may include injection ports 201*a* and 201*b*. The injection ports 201*a* and 201*b* may be connected to the steam supply line 213 and the gas supply line 223. Specifically, the steam supply line 213 connected to the steam supplier 210 and the gas supply line 223 connected to the gas supplier 220 may be joined with the injection ports 201*a* and 201*b* below the nozzle 201. That is to say, the steam generated by the steam supplier 210 moves through the steam supply line 213, and may be injected outside through the injection ports 201*a* and 201*b* of the nozzle 201. Also, the gas generated by the gas supplier 220 moves through the gas supply line 223, and may be injected outside through the injection ports 201*a* and 201*b* of the nozzle 201.

The plate 203 may be located below the nozzle 201, and may include a sensor unit 205. The sensor unit 205 may include a temperature sensor 205*a* (e.g., thermocouple, thermal camera) and first and second pressure sensors 205*b* and 205*c* (e.g., manometer). The temperature sensor 205*a* and the first pressure sensor 205*b* may be placed on the steam supply line 213. The temperature sensor 205*a* and the first pressure sensor 205*b* may measure the temperature and pressure of the steam. The second pressure sensor 205*c* may be located on the gas supply line 223. The second pressure sensor 205*c* may measure the pressure of the gas. Information measured by the temperature sensor 205*a* and the first and second pressure sensors 205*b* and 205*c* may be transmitted to a controller 1000. The controller 1000 may control the first and second control valves 215 and 225, using information of the temperature sensor 205*a* and the first and second pressure sensors 205*b* and 205*c*.

A drive unit 209 may be located under the plate 203 and may move in a horizontal direction. For example, the drive unit 209 may reciprocate (e.g., move back and forth) along the first direction D1. The drive unit 209 may have a rectangular shape, but is not limited thereto, and may be powered by an electric motor to reciprocate along the first direction D1. Accordingly, the plate 203 and the nozzle 201 on the drive unit 209 may also reciprocate along the first direction D1. Therefore, since the stream injector 200 may inject steam to a wide area in the first direction D1, the plurality of semiconductor packages 5 may be uniformly cleaned.

The exhauster 230 may be located between the upper guide 21 and the lower guide 23. The exhauster 230 may discharge the steam injected from the steam injector 200 to the outside. Steam formed at a high temperature and a high pressure may cause problems in the substrate sawing device 10 and the substrate sorting device 30 of FIG. 1. The exhauster 230 may limit and/or prevent steam from moving from the substrate cleaning device 20 to the substrate sawing device 10 or the substrate sorting device 30. Therefore, various problems caused by the steam in the substrate sawing device 10 and the substrate sorting device 30 may be limited and/or prevented. For example, the exhauster 230 may include a fan.

The drainer 240 may be placed below the lower guide 23. In some embodiments, the drainer 240 may be a tub with an inclined sidewall and may include a drain at a base thereof that connects through piping to the outside, but example embodiments are not limited thereto. In a method for manufacturing a semiconductor package, which will be described below, the steam after cleaning the plurality of semiconductor packages 5 may be formed into waste water containing foreign matter. Waste water may move to the drainer 240 through the slit 23*a* of the lower guide 23. Since the drainer 240 is connected to the outside, it may discharge the waste water to the outside. That is, the interior of the substrate cleaning device 20 may be maintained in a constant condition by the drainer 240. Therefore, the cycle of preventive maintenance of the substrate cleaning device 20 is lengthened, and the productivity of semiconductor packages can be improved.

The controller 1000 may send signals to the drive unit 209, the exhauster 230 and the drainer 240 to operate the drive unit 209, the exhauster 230 and the drainer 240 while steam is being injected from the steam injector 200. In other words, the drive unit 209, the exhauster 230, and the drainer 240 may operate only while the cleaning process is in progress, but is not limited thereto.

Figure 4:
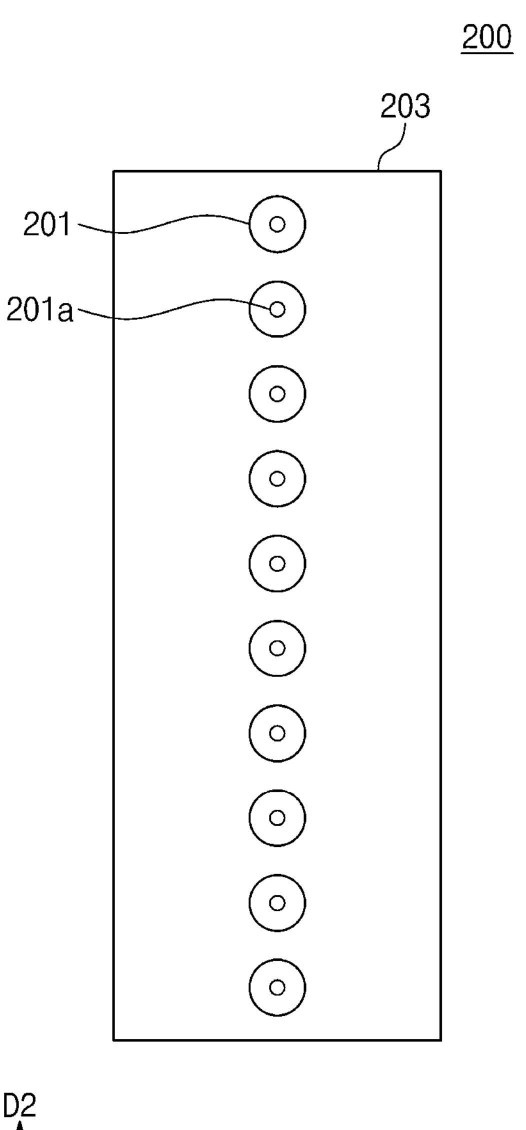
FIGS. 4 and 5 are plan views for explaining the stream injector of the substrate cleaning apparatus according to example embodiments.
Figure 5:
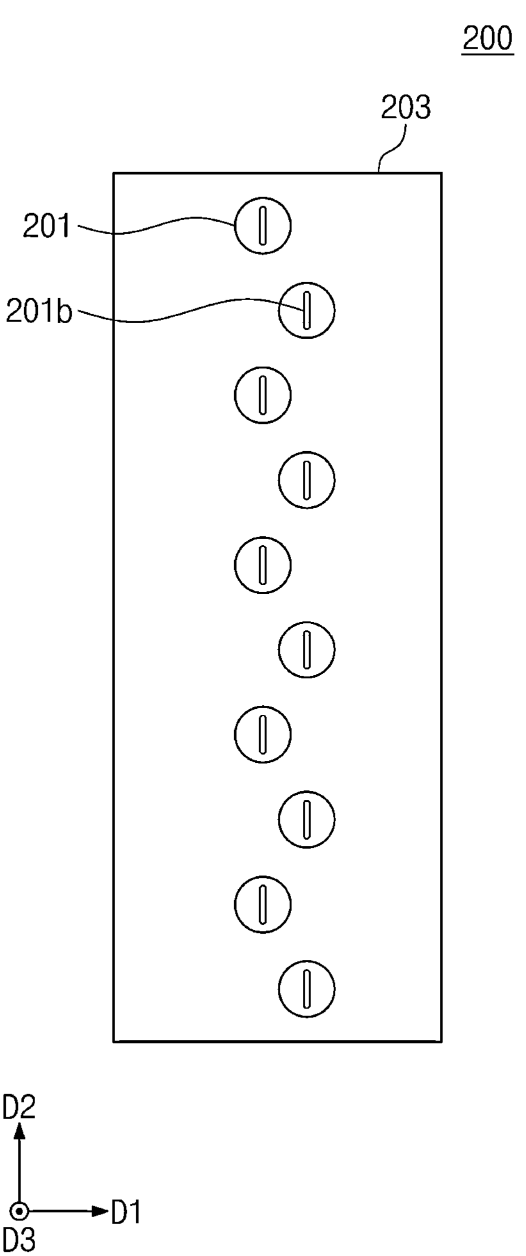

FIGS. 4 and 5 are plan views for explaining the stream injector of the substrate cleaning device according to example embodiments.

Hereinafter, for convenience of description, descriptions of the same contents as those described with reference to FIG. 2 will be omitted, and differences will be described in detail.

Referring to FIGS. 4 and 5, the stream injector 200 of the substrate cleaning device 20 may include the plurality of nozzles 201. Each of the plurality of nozzles 201 may include injection ports 201*a* and 201*b*. The plurality of nozzles 201 may be placed on the plate 203 and may be arranged in one direction. In other words, each of the plurality of nozzles 201 may be spaced apart from each other and placed along the second direction D2. Accordingly, the steam injector 200 may inject steam to a wide area in the second direction D2. Therefore, the drive unit 209 and the plurality of nozzles 201 of FIG. 2 allow the steam injector 200 to widely inject steam on a plane defined by the first and second directions D1 and D2.

Referring to FIG. 4, the plurality of nozzles 201 may be placed along the second direction D2 and aligned in the second direction D2. From a planar viewpoint, each injection port 201*a* of the plurality of nozzles 201 may have a circular shape. As a result, the steam may be injected from the injection port 201*a* at a high pressure, but the injected area may be narrow.

Referring to FIG. 5, the plurality of nozzles 201 are placed along the second direction D2, but may not be aligned in the second direction D2. That is, the plurality of nozzles 201 may be placed in a zigzag form. This makes it possible to limit and/or minimize overlapping of the areas of each of the plurality of nozzles 201 to which steam is injected, and the steam injector 200 may inject steam to a wide area. From a planar viewpoint, each injection port 201*b* of each of the plurality of nozzles 201 may have a long shape in any one direction. As a result, the steam may be injected from the injection port 201*b* to a wider area than in FIG. 4, but the pressure may decrease. Each injection port 201*b* of the plurality of nozzles 201 may have a long shape in the second direction D2, but is not limited thereto. That is, each injection port 201*b* of the plurality of nozzles 201 may have a long shape in the first direction D1.

However, example embodiments are not limited thereto. That is, each of the injection holes 201*a* and 201*b* of the plurality of nozzles 201 may have different shapes from each other. Alternatively, the sizes of the injection ports 201*a* and 201*b* of each the plurality of nozzles 201 may be different from each other.

Figure 6:
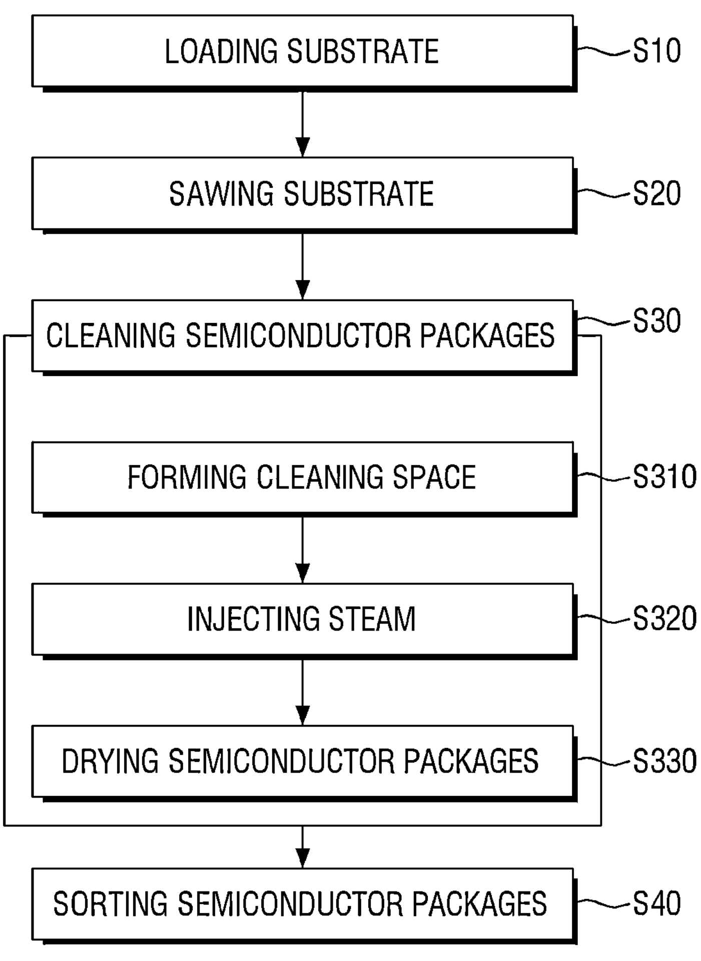
FIG. 6 is a flow chart showing a method for manufacturing a semiconductor package according to example embodiments.
Figure 7:
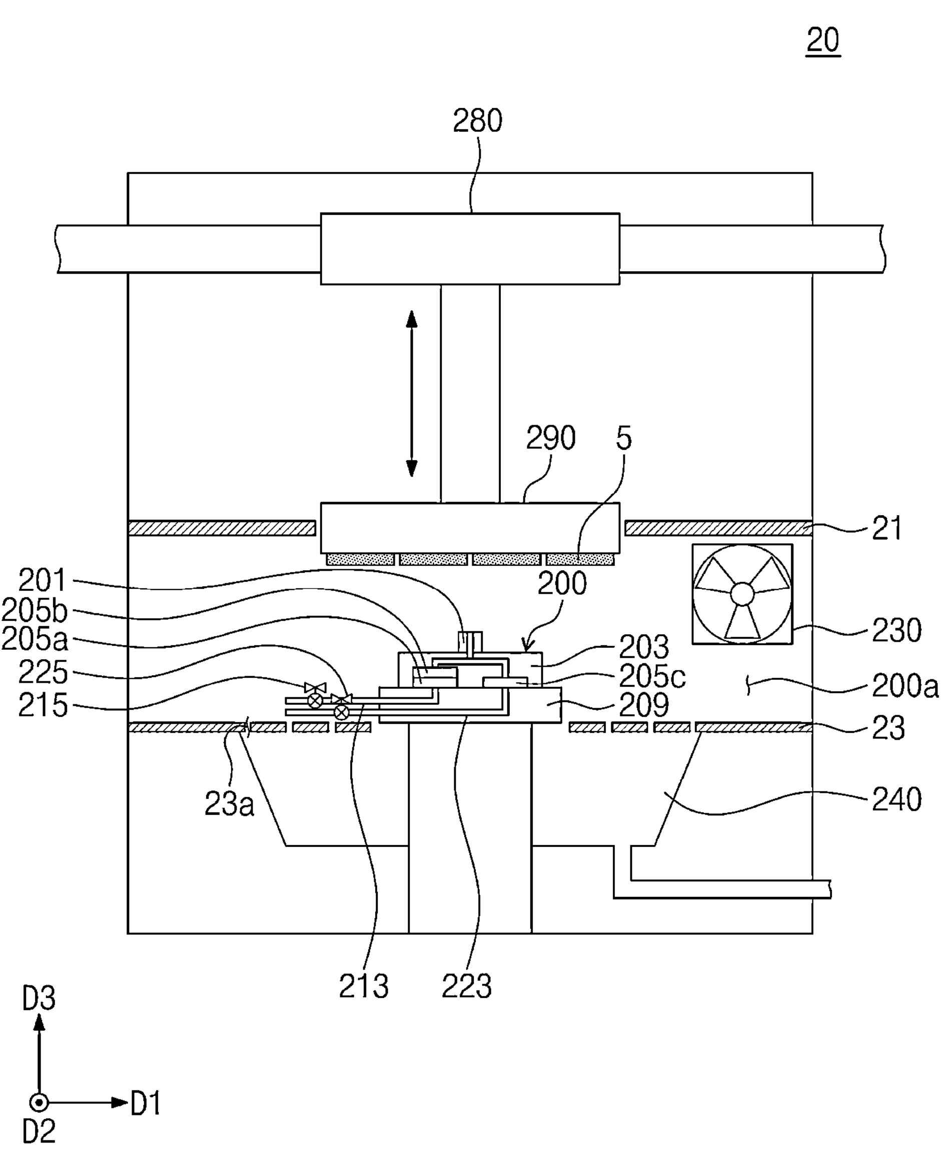
FIGS. 7 to 9 are cross-sectional views for explaining a method for manufacturing the semiconductor package according to example embodiments.
Figure 8:
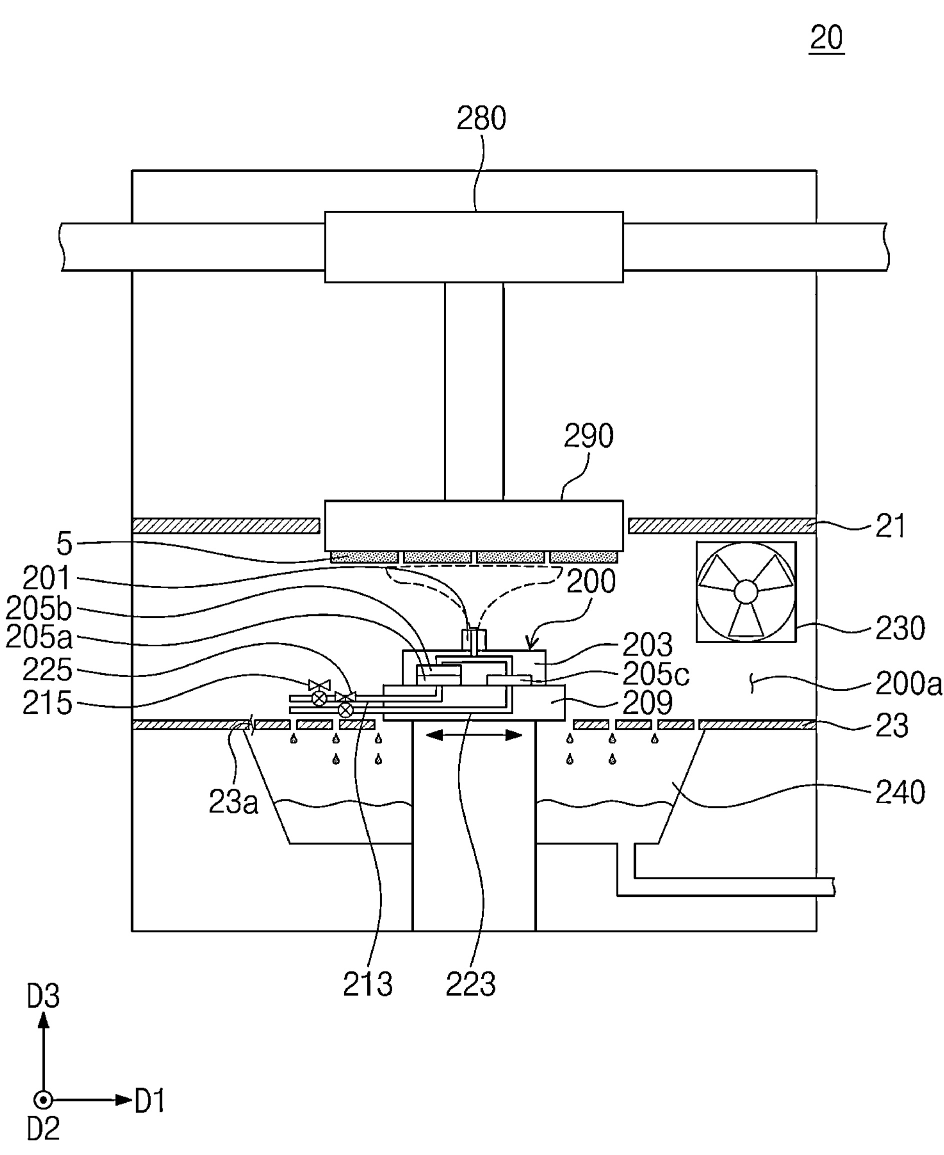
Figure 9:
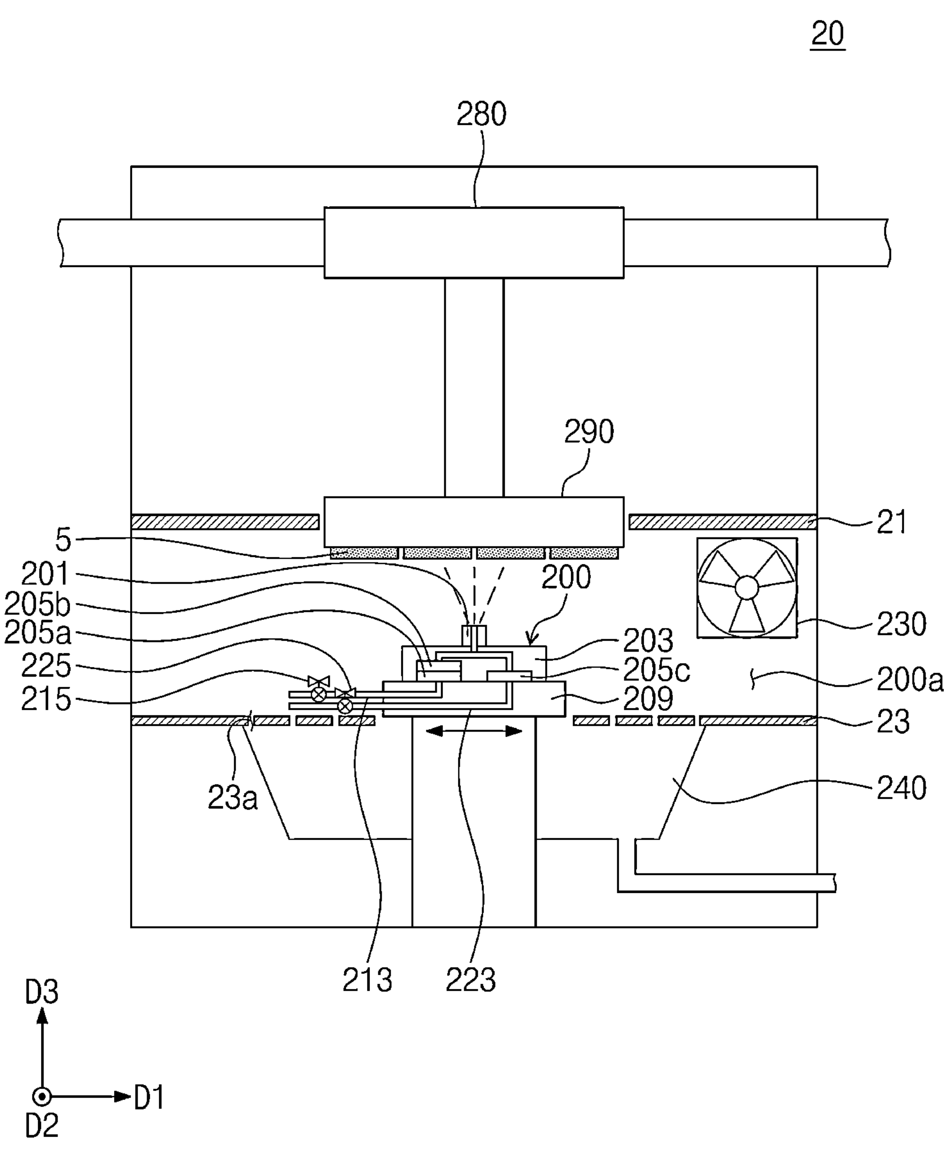

FIG. 6 is a flow chart showing a method for manufacturing a semiconductor package according to example embodiments. FIGS. 7 to 9 are cross-sectional views for explaining the method for manufacturing the semiconductor package according to example embodiments.

Referring to FIG. 6, the method for manufacturing the semiconductor package includes an operation of loading a substrate (S10), an operation of sawing the substrate (S20), an operation of cleaning the semiconductor packages (S30), and an operation of sorting the semiconductor packages (S40). The operation of loading the substrate (S10) may be performed by the loading device 500 of the semiconductor apparatus 1 of FIG. 1. The operation of sawing the substrate (S20) may be performed by the substrate sawing device 10 of FIG. 1. The operation of sorting the semiconductor packages (S40) may be performed by the substrate sorting device 30 of FIG. 1. The operation of cleaning the semiconductor packages (S30) may include an operation of forming a cleaning space (S310), an operation of injecting the steam (S320), and an operation of drying the semiconductor packages (S330), which will be described below in detail.

Referring to FIGS. 6 and 7, the operation of forming the cleaning space (S310) may include movement of the second pickup unit 290 in the third direction D3. A plurality of semiconductor packages 5 may move to the substrate cleaning device 20 by the second conveyor 280 and the second pickup unit 290. After the second conveyor 280 is located over the nozzle 201 of the substrate cleaning device 20, the second pickup unit 290 may move in the third direction D3. Therefore, the plurality of semiconductor packages 5 fixed to the second pickup unit 290 may be brought closer to the nozzle 201.

In other words, the second pickup unit 290 may move in the third direction D3 until it is located on the same plane as the upper guide 21. From a planar viewpoint, the upper guide 21 may have a form that surrounds the second pickup unit 290. Therefore, a cleaning space 200*a* may be formed between the upper guide 21 and the lower guide 23. That is, the cleaning space 200*a* is defined by the upper guide 21, the lower guide 23 and the second pickup unit 290, and may be spaced apart from the substrate sawing device 10 and the substrate sorting device 30 of FIG. 1. Therefore, the steam injected from the nozzle 201 may not move to the substrate sawing device 10 and the substrate sorting device 30.

Referring to FIGS. 3, 6 and 8, the operation of injecting steam (S320) may include an operation of supplying steam by the steam supplier 210, an operation of supplying gas by the gas supplier 220, an operation of the drive unit 209 reciprocating in a horizontal direction, and an operation of operating the exhauster 230 and the drainer 240 by the controller 1000.

According to an embodiment, the controller 1000 may open the first control valve 215 after the cleaning space 200*a* is formed. Therefore, the steam supplier 210 may supply steam to the steam injector 200 through the steam supply line 213. The steam injected from the nozzle 201 of the steam injector 200 may remove some the foreign matter adhering to the plurality of semiconductor packages 5 on the second pickup unit 290. The steam after cleaning the plurality of semiconductor packages 5 may be converted into waste water containing the foreign matter. Waste water may move to the drainer 240 through the slit 23*a* of the lower guide 23.

According to another embodiment, after the cleaning space 200*a* is formed, the controller 1000 may open the first and second control valves 215 and 225 simultaneously. That is, the supply of steam by the steam supplier 210 and the supply of gas by the gas supplier 220 may be performed at the same time. Since steam and gas are simultaneously supplied to the steam injector 200, the pressure of the injected steam may increase. Therefore, the detergency of the substrate cleaning device 20 may increase.

The controller 1000 may send signals to the drive unit 209, the exhauster 230 and the drainer 240 to operate the drive unit 209, the exhauster 230 and the drainer 240. Accordingly, the drive unit 209 may reciprocate in the horizontal direction (e.g., the first direction D1). The exhauster 230 may exhaust the heat generated by the steam to the outside. The drainer 240 may discharge the waste water to the outside.

Temperature and pressure of steam may be important factors in the operation of cleaning the semiconductor package (S30). In other words, the higher the temperature and pressure of the steam are, the higher the detergency is. However, a plurality of semiconductor packages 5 are damaged or the printed marking is erased, which may cause defective products. Therefore, suitable and constant temperature and pressure of steam may be required. For example, the temperature of steam may be from about 140° C. to about 180° C. The pressure of steam may be from about 6 Bar to about 10 Bar. Therefore, while injecting the steam, information about the temperature and pressure of steam measured by the temperature sensor 205*a* and the first pressure sensor 205*b* of the sensor unit 205 may be transmitted to the controller 1000 to obtain constant temperature and pressure of steam. Information about the pressure of the gas measured by the second pressure sensor 205*c* of the sensor unit 205 may also be transmitted to the controller 1000.

According to an embodiment, the controller 1000 may control the first control valve 215, using information transmitted from the sensor unit 205. That is, the controller 1000 may close the first control valve 215 when the temperature and pressure of steam deviate from control threshold values. The control threshold values may be values set by a user, but are not limited thereto. In other words, transmission of information to the controller 1000 by the sensor unit 205 may include interruption of the cleaning (S30) of the semiconductor packages by the controller 1000. In this case, the controller 1000 may display an error to the user. In some embodiments, the control threshold values may include a first temperature threshold value and a second temperature threshold value that is greater than the first temperature threshold value. The control threshold values may also include a first pressure threshold value and a second pressure threshold value that is greater than the first pressure threshold value. In some embodiments, the controller 1000 may close the first control valve 215 if the temperature of steam is outside of a range from the first temperature threshold value to the second temperature threshold value and/or if the pressure if steam is outside of a range from the first pressure threshold value to the second pressure threshold value.

According to another embodiment, the controller 1000 may send a signal to the steam supplier 210, using information transmitted from the sensor unit 205. That is, when the temperature and pressure of the steam deviate from values set by the user, the controller 1000 may send a signal to the heater and pressurizer of the steam supplier 210. Specifically, if the temperature of the steam differs from the set value, the controller 1000 may send a signal to the heater of the steam supplier 210 to increase or decrease the temperature of the steam. If the pressure of steam differs from the set value, the controller 1000 may send the signal to the pressurizer of the steam supplier 210 to increase or decrease the pressure of steam.

Accordingly, the controller 1000 may control the temperature and pressure of the steam. In other words, transmission of information to the controller 1000 by the sensor unit 205 may include control of the temperature and pressure of the steam by the controller 1000. Therefore, the substrate cleaning device 20 may continuously perform the cleaning process, while keeping the temperature and pressure of the steam constant. Therefore, the productivity of semiconductor package can be improved.

Referring to FIGS. 3, 6, and 9, the operation of drying the semiconductor package (S330) may include supplying of gas by the gas supplier 220 and horizontal reciprocation of the drive unit 209.

For example, the controller 1000 may send the signal to the first control valve 215 to close the first control valve 215. The controller 1000 may send the signal to the second control valve 225 to open the second control valve 225. That is, the steam supply from the steam supplier 210 is shut off, and the gas may be supplied from the gas supplier 220. Therefore, the gas may dry the plurality of semiconductor packages 5.

Similarly to the operation of injecting the steam (S320), the drive unit 209 may reciprocate in the horizontal direction (e.g., the first direction). Therefore, the plurality of semiconductor packages 5 may be dried uniformly.

The exhauster 230 and the drainer 240 may operate in the same manner as the operation of injecting the steam (S320), but are not limited thereto. That is, in the operation of drying the semiconductor packages (S330), only the exhauster 230 may operate, and the drainer 240 may not operate.

The method for manufacturing the semiconductor package according to example embodiments may clean a plurality of semiconductor packages 5 using steam. That is, since the plurality of semiconductor packages 5 do not come into direct contact with the cleaning device, it is possible to limit and/or prevent wear of the cleaning device such as a conventional brush. Also, it is possible to limit and/or prevent the plurality of semiconductor packages 5 from being damaged by coming into direct contact with the cleaning device. Therefore, the productivity of semiconductor packages can be improved, and a semiconductor package with improved reliability may be provided.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Although example embodiments have been described above with reference to the accompanying drawings, those skilled in the art will appreciate that inventive concepts may be embodied in other specific forms without changing the technical spirit or essential features of inventive concepts. Accordingly, the above-described embodiments should be understood in all respects as illustrative and not restrictive.

What is claimed is:

1. A substrate cleaning apparatus comprising:

a steam injector configured to clean a substrate;

a steam supplier configured to supply a steam; and a gas supplier configured to supply a gas, wherein the steam injector includes a drive unit configured to move horizontally, a plate on the drive unit, and a plurality of nozzles on the plate, the plate includes a temperature sensor, a first pressure sensor, and a second pressure sensor, each of the plurality of nozzles is connected to the steam supplier and the gas supplier, and the plurality of nozzles are arranged in a first direction from a planar viewpoint.

2. The substrate cleaning apparatus of claim 1, further comprising:

a steam supply line; and a gas supply line, each of the plurality of nozzles is connected to the steam supplier through the steam supply line and is connected to the gas supplier through the gas supply line, the temperature sensor and the first pressure sensor are on the steam supply line, and the second pressure sensor is on the gas supply line.

3. The substrate cleaning apparatus of claim 2, further comprising:

a first control valve on the steam supply line;

a second control valve on the gas supply line; and a controller configured to control the first control valve and the second control valve.

4. The substrate cleaning apparatus of claim 1, wherein each of the plurality of nozzles includes an injection port through which the steam and the gas are injected.

5. The substrate cleaning apparatus of claim 4, wherein in the plurality of nozzles, the injection port has a circular shape from a planar viewpoint.

6. The substrate cleaning apparatus of claim 4, wherein in the plurality of nozzles, the injection port has a linear shape in any one direction from a planar viewpoint.

7. The substrate cleaning apparatus of claim 1, wherein in a planar viewpoint, the plurality of nozzles are arranged in a zigzag form.

8. The substrate cleaning apparatus of claim 1, further comprising:

a preliminary cleaner, wherein the preliminary cleaner is spaced apart from the steam injector in a horizontal direction.

9. The substrate cleaning apparatus of claim 8, wherein the preliminary cleaner includes a sponge brush.

10. The substrate cleaning apparatus of claim 1, further comprising:

an exhauster configured to discharge heat generated from the steam to outside; and a drainer configured to discharge waste water to outside.

11. The substrate cleaning apparatus of claim 1, wherein, in a planar view, the plurality of nozzles are arranged in the first direction in a zigzag form.

12. The substrate cleaning apparatus of claim 1, wherein, in a planar view, the plurality of nozzles are arranged in two rows extending in the first direction, and the two rows are spaced apart from each other in a second direction perpendicular to the first direction.

* * * * *